United States Patent
Yamamoto

(10) Patent No.: US 9,971,256 B2
(45) Date of Patent: May 15, 2018

(54) IMPRINT APPARATUS, IMPRINT METHOD, AND METHOD OF MANUFACTURING ARTICLE

(71) Applicant: CANON KABUSHIKI KAISHA, Tokyo (JP)

(72) Inventor: Kenji Yamamoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 637 days.

(21) Appl. No.: 14/302,566

(22) Filed: Jun. 12, 2014

(65) Prior Publication Data

US 2014/0367874 A1 Dec. 18, 2014

(30) Foreign Application Priority Data

Jun. 18, 2013 (JP) .................................. 2013-127986

(51) Int. Cl.
*B29C 59/00* (2006.01)
*G03F 9/00* (2006.01)
*G03F 7/00* (2006.01)

(52) U.S. Cl.
CPC .......... *G03F 9/7003* (2013.01); *G03F 7/0002* (2013.01)

(58) Field of Classification Search
CPC ........ G03F 7/0002; G03F 9/00; G03F 9/7003; G03F 9/7007; G03F 9/7011; G03F 9/7015; G03F 9/7023; G03F 9/7042
See application file for complete search history.

(56) References Cited

U.S. PATENT DOCUMENTS

| | | | |
|---|---|---|---|
| 2010/0148397 A1 | 6/2010 | Nakamura et al. | |
| 2010/0308485 A1 | 12/2010 | Inanami et al. | |
| 2012/0091611 A1 | 4/2012 | Yanagisawa | |
| 2012/0217675 A1 | 8/2012 | Usui | |
| 2013/0015599 A1 | 1/2013 | Kawahara | |

FOREIGN PATENT DOCUMENTS

| | | |
|---|---|---|
| JP | 2006-165371 A | 6/2006 |
| JP | 2012-084732 A | 4/2012 |
| JP | 2012-178470 A | 9/2012 |
| KR | 10-1087365 B1 | 11/2011 |
| KR | 20120038376 A | 4/2012 |
| KR | 10-1511411 B1 | 4/2015 |

OTHER PUBLICATIONS

Office Action issued in Korean Application No. KR10-2014-0069912 dated Jun. 21, 2016.
Office Action issued in Chinese Appln. No. 201410262315.3 dated Jul. 25, 2017. English translation provided.

*Primary Examiner* — Timothy Kennedy
(74) *Attorney, Agent, or Firm* — Rossi, Kimms & McDowell LLP

(57) ABSTRACT

The present invention provides an imprint apparatus which transfers the pattern of the mold to a target region on the substrate, comprising a control unit configured to align the mold and the target region in a surface direction parallel to a surface of the substrate, and drive at least one of the mold and the substrate so that the mold and an imprint material on the target region are brought into contact with each other, wherein in the alignment in the surface direction before the contact, the control unit shifts a relative position between the mold and the target region based on a shift amount of the pattern of the mold from the target region in the surface direction in the driving which causes the contact, so that the relative position after the contact is set within an allowable range.

12 Claims, 6 Drawing Sheets

| ShotNo | Shift_X | Shift_Y | Rot_X | Rot_Y | Mag_X | Mag_Y | Trap_X | Trap_Y |
|---|---|---|---|---|---|---|---|---|
| 1 | -15.9 | 18.2 | -0.411 | -0.411 | 1.583 | -1.583 | 28.596 | 14.313 |
| 2 | -21.7 | 26.9 | -0.462 | -0.462 | 2.672 | -2.672 | 29.099 | 17.26 |
| 3 | -8.1 | 13.2 | -0.42 | -0.42 | 2.782 | -2.782 | 31.021 | 14.782 |
| 4 | -17.9 | 24.1 | -0.236 | -0.236 | 3.798 | -3.798 | 28.405 | 15.486 |
| 5 | -11.6 | 1.9 | -0.424 | -0.424 | 2.591 | -2.591 | 30.564 | 17.147 |
| 6 | -19.9 | 20.8 | -0.462 | -0.462 | 2.899 | -2.899 | 29.353 | 17.41 |
| 7 | -3.7 | 5.6 | -0.455 | -0.455 | 2.879 | -2.879 | 29.319 | 16.408 |
| 8 | -22.5 | 18.9 | -0.54 | -0.54 | 3.832 | -3.832 | 27.238 | 14.534 |
| 9 | -35.1 | 32 | -0.42 | -0.42 | 3.079 | -3.079 | 29.455 | 16.525 |
| 10 | -24.5 | 13.6 | -0.499 | -0.499 | 2.878 | -2.878 | 29.334 | 17.733 |
| ⋮ | ⋮ | ⋮ | ⋮ | ⋮ | ⋮ | ⋮ | ⋮ | ⋮ |

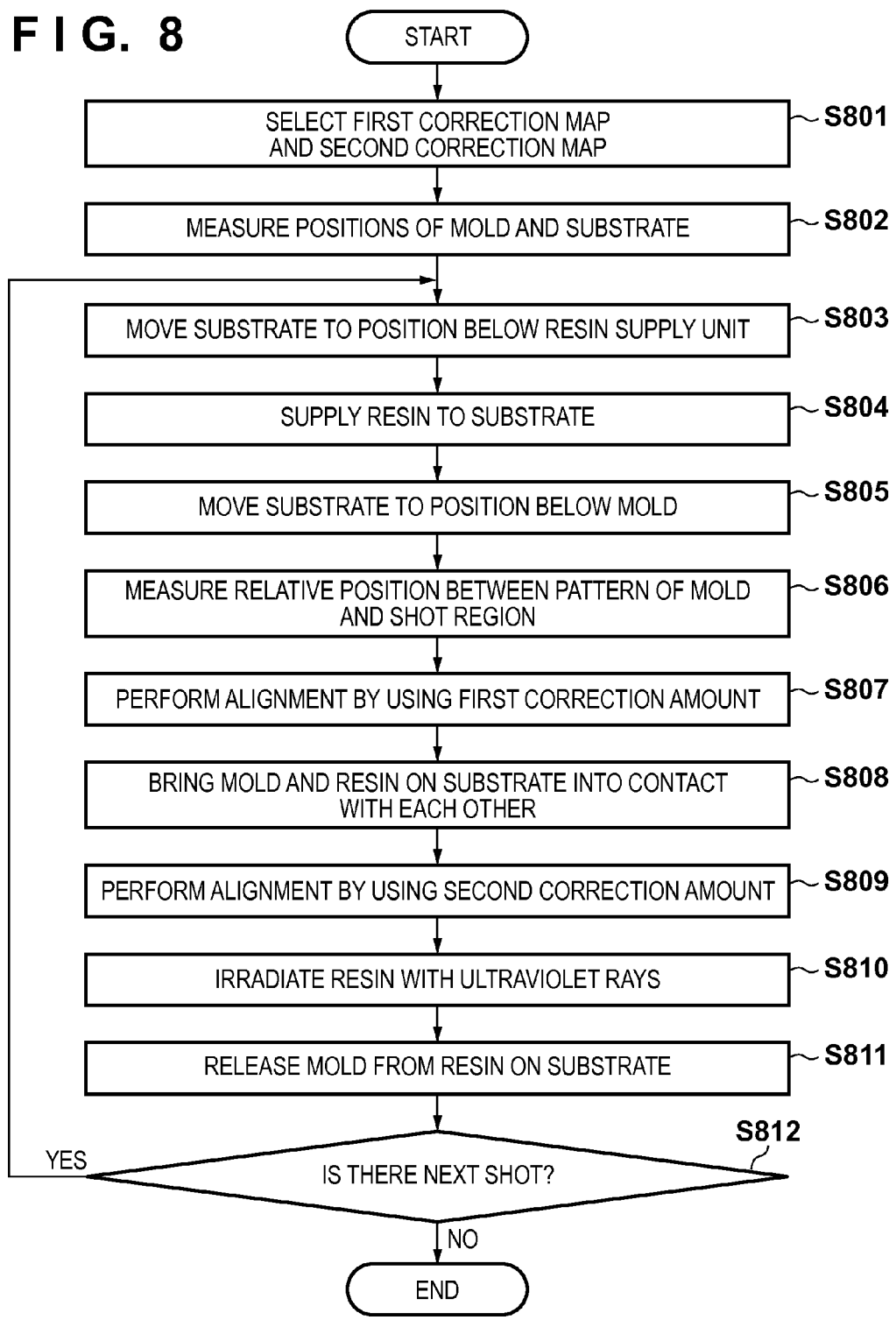

IMPRINT APPARATUS, IMPRINT METHOD, AND METHOD OF MANUFACTURING ARTICLE

BACKGROUND OF THE INVENTION

Field of the Invention

The present invention relates to an imprint apparatus, an imprint method, and a method of manufacturing an article.

Description of the Related Art

An imprint technique that transfers a pattern formed on a mold to a substrate is attracting attention as one of lithography techniques for manufacturing semiconductor devices. In an imprint apparatus using this technique, a mold on which a pattern is formed and an imprint material supplied on a substrate are brought into contact with each other, and the imprint material is cured in this state. The pattern of the mold can be transferred to the substrate by separating the mold from the cured imprint material.

Since the imprint apparatus is required to accurately transfer the mold pattern to the substrate, it is important to accurately align the mold and substrate in a surface direction parallel to the surface of the substrate. Therefore, Japanese Patent Laid-Open No. 2006-165371 has disclosed a method of aligning a mold and substrate in the surface direction while the mold and an imprint material on the substrate are in contact with each other.

When aligning a mold and substrate in the surface direction while the mold and an imprint material on the substrate are in contact with each other, the relative position of the mold and substrate are difficult to change, so it takes a considerable time to perform this alignment. In the imprint apparatus, therefore, it is necessary to first align a mold and substrate in the surface direction while the mold and an imprint material on the substrate are not in contact with each other, and then bring the mold and the imprint material on the substrate into contact with each other. However, when alignment is performed in the surface direction while a mold and an imprint material on a substrate are not in contact with each other, a mold pattern transferred to the substrate sometimes shifts from a transfer target position on the substrate.

SUMMARY OF THE INVENTION

The present invention provides a technique advantageous in accurately positioning a mold.

According to one aspect of the present invention, there is provided an imprint apparatus which cures an imprint material on a substrate using a mold on which a pattern is formed, thereby transferring the pattern of the mold to a target region on the substrate, comprising: a control unit configured to align the mold and the target region in a surface direction parallel to a surface of the substrate, and drive at least one of the mold and the substrate so that the mold and the imprint material are brought into contact with each other, wherein in the alignment in the surface direction before the contact, the control unit shifts a relative position between the mold and the target region from the relative position when the mold and the target region are aligned, based on a shift amount indicating an amount of shift of the pattern of the mold from the target region in the surface direction in the driving which causes the contact, so that the relative position after the contact is set within an allowable range.

Further features of the present invention will become apparent from the following description of exemplary embodiments with reference to the attached drawings.

BRIEF DESCRIPTION OF THE DRAWINGS

FIG. 8 is a flowchart showing an operation sequence in an imprint process of the second embodiment.

DESCRIPTION OF THE EMBODIMENTS

Figure 1:
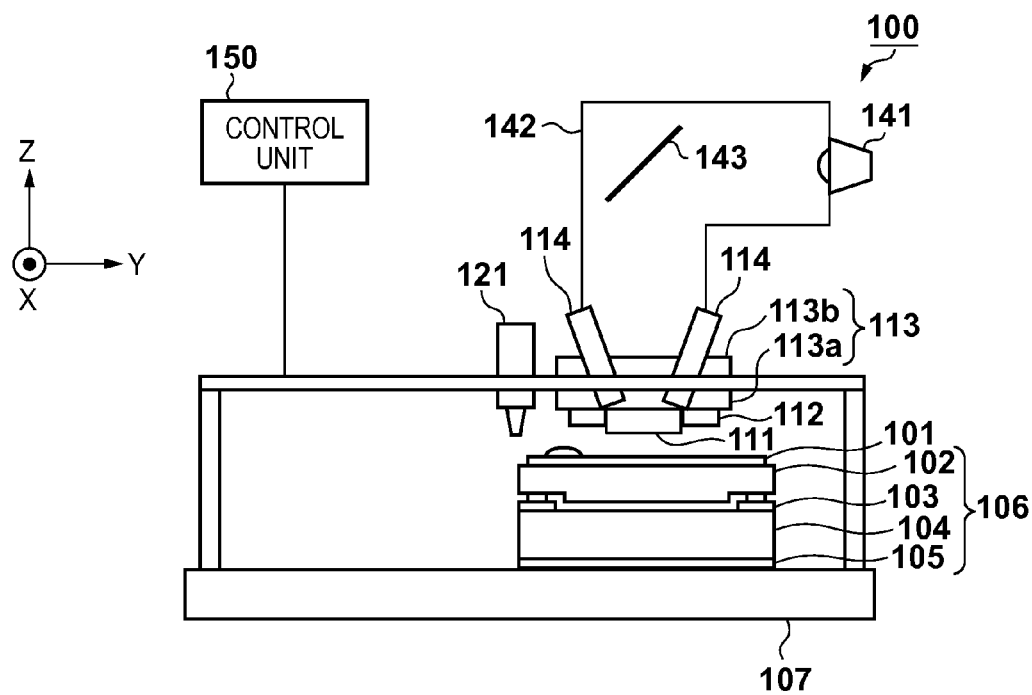
FIG. 1 is a view showing an imprint apparatus of the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 100 of the first embodiment of the present invention will be explained with reference to FIG. 1. The imprint apparatus 100 is used in the manufacture of a semiconductor device or the like, and cures an imprint material (resin) on a substrate 101 while a mold 111 having a pattern formed on it is in contact with the imprint material. The imprint apparatus 100 can transfer the pattern to the substrate 101 by separating the mold 111 from the cured imprint material by widening the spacing between the mold 111 and substrate 101. The method of curing the imprint material includes a heat cycle method using heat and photo-curing method using light. The imprint apparatus 100 of the first embodiment adopts the photo-curing method. The photo-curing method is a method by which an uncured ultraviolet-curing resin (to be referred to as a resin hereinafter) is supplied as the imprint material on a substrate, and the resin is cured as it is irradiated with ultraviolet rays while the substrate 101 and mold 111 are brought into contact with each other with the resin being sandwiched between them. After the resin is cured by the ultraviolet irradiation, a pattern can be formed on the substrate by separating the mold 111 from the resin.

FIG. 1 is a view showing the imprint apparatus 100 of the first embodiment. The imprint apparatus 100 includes a substrate stage 106 for holding the substrate 101, a mold holding unit 113 for holding the mold 111, a measurement unit 114, an irradiation unit 142, and a resin supply unit 121. The imprint apparatus 100 also includes a CPU, a memory, and a control unit 150 for controlling an imprint process (controlling the individual units of the imprint apparatus 100).

As the substrate 101, a single-crystal silicon substrate, SOI (Silicon On Insulator) substrate, or the like is used. The resin supply unit 121 (to be described later) supplies a resin (ultraviolet-curing resin) to the upper surface (surface to be processed) of the substrate 101. The mold 111 is normally made of a material such as quartz capable of transmitting ultraviolet rays. A projection-and-recess pattern to be transferred to the substrate 101 is formed in a partial region 111a on that surface of the mold 111, which faces the substrate.

The substrate stage 106 can include, for example, a fine-motion stage 102 and coarse-motion stage 104. The fine-motion stage 102 holds the substrate 101 by, for example, a vacuum suction force or electrostatic force, and can be moved in the X, Y, Z, ωX, ωY, and ωZ directions by a fine-motion actuator 103. The coarse-motion stage 104 holds the fine-motion stage 102 with the fine-motion actuator 103 intervening between them, and can be moved in the X, Y, and ωZ directions by a coarse-motion actuator 105. A stage platen 107 placed on the floor surface supports the coarse-motion stage 104 via the coarse-motion actuator 105. To simplify the arrangement of the substrate stage 106 while ensuring its rigidity, it is also possible to integrate the fine-motion stage 102 and coarse-motion stage 104, and set only the X, Y, and ωZ directions as the moving directions.

The mold holding unit 113 includes a mold chuck 113a for holding a mold by, for example, a vacuum suction force or electrostatic force, and a mold driving unit 113b for driving the mold chuck 113a in the Z, ωX, ωY directions. Each of the mold chuck 113a and mold driving unit 113b has an opening region (not shown) in the central portion (inside), so light emitted from the irradiation unit 142 irradiates the substrate 101 through the mold 111. Also, the mold driving unit 113b includes, for example, an actuator such as a linear motor or air cylinder, and drives the mold chuck 113a (mold 111) in the Z direction so as to bring the mold 111 into contact with resin on the substrate or separate the mold 111 therefrom. When bringing the mold 111 into contact with the resin on the substrate or separating the mold 111 therefrom, the mold driving unit 113b must accurately drive the mold chuck 113a. Therefore, the mold driving unit 113b may also be configured by a plurality of driving systems such as a coarse-motion driving system and fine-motion driving system. In the imprint apparatus 100 of the first embodiment, the mold driving unit 113b performs an operation of changing the distance between the substrate 101 and mold 111. However, this operation may be performed by the substrate stage 106, and may also be relatively performed by both the mold driving unit 113b and substrate stage 106.

Figure 2:
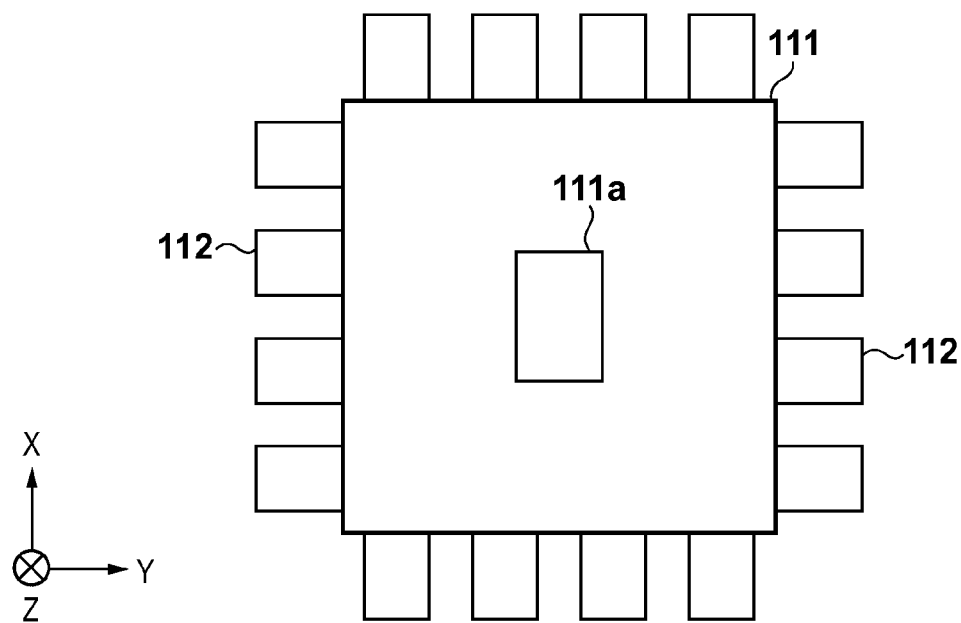
FIG. 2 is a view showing the arrangement of a correction unit.

In the region 111a on the mold, deformation containing a component such as a magnification component or trapezoidal component sometimes occurs due to, for example, a manufacturing error or thermal deformation. Therefore, the mold holding unit 113 includes a correction unit 112 for correcting the deformation of the mold 111 by applying forces to a plurality of portions on the side surfaces of the mold 111. FIG. 2 is a view showing the arrangement of the correction unit 112 for correcting the deformation of the mold 111, in which the mold 111 is viewed from below (in the −Z direction). The correction unit 112 includes a plurality of actuators. In this example shown in FIG. 2, four actuators are arranged on each side of the mold 111. The deformation of the region 111a on the mold can be corrected by individually applying forces to the side surfaces of the mold 111 by these actuators. As each actuator of the correction unit 112, a linear motor, air cylinder, piezo actuator, or the like is used.

To cure the resin on the substrate, the irradiation unit 142 irradiates the resin on the substrate with light (ultraviolet rays) through the mold 111. The irradiation unit 142 includes, for example, a light source 141 for emitting light (ultraviolet rays) for curing the resin on the substrate, and a mirror 143 for bending the optical path of the light emitted from the light source 141. The irradiation unit 142 can also include a plurality of optical elements (not shown) for adjusting the light emitted from the light source 141 into light appropriate in the imprint process. The resin supply unit 121 supplies (dispenses) a resin (uncured resin) on the substrate. In the first embodiment as described previously, an ultraviolet-curing resin that cures by irradiation with ultraviolet rays is used. However, the type of resin to be supplied on the substrate from the resin supply unit 121 can properly be selected in accordance with various conditions in semiconductor device manufacturing steps. Also, the amount of resin to be discharged from a discharge nozzle of the resin supply unit 121 can properly be determined by taking account of, for example, the thickness or density of a pattern transferred to the resin on the substrate. In addition, the wavelength of light to be emitted from the light source 141 can properly be determined in accordance with the type of resin.

The measurement unit 114 measures the relative position between a shot region formed on the substrate and the region 111a on the mold where the pattern is formed. For example, a plurality of alignment marks (to be referred to as marks hereinafter) are formed in each of the shot region and the region 111a on the mold. The measurement unit 114 includes a plurality of scopes, and each scope detects the mark in the shot region and the mark in the region 111a on the mold. The measurement unit 114 can measure the relative position between the shot region and the region 111a on the mold based on the detection results of the mark in the shot region and the mark in the region 111a on the mold, which are detected by each scope.

Alignment between the mold 111 and substrate 101 in the imprint process will be explained below. Alignment between the mold 111 and substrate 101 in the imprint apparatus 100 generally includes a global alignment method and die-by-die alignment method. The global alignment method is an alignment method of performing alignment based on the positions of all shot regions determined by processing the detection results of marks formed in some typical shot regions (sample shot regions). On the other hand, the die-by-die alignment method is an alignment method of correcting misalignment between the relative position between the substrate 101 and mold 111 by optically detecting the marks formed in each shot region on the substrate and the marks formed on the mold. In the first embodiment, a method of aligning the mold 111 and substrate 101 by using the die-by-die alignment method will be explained.

Figure 3:
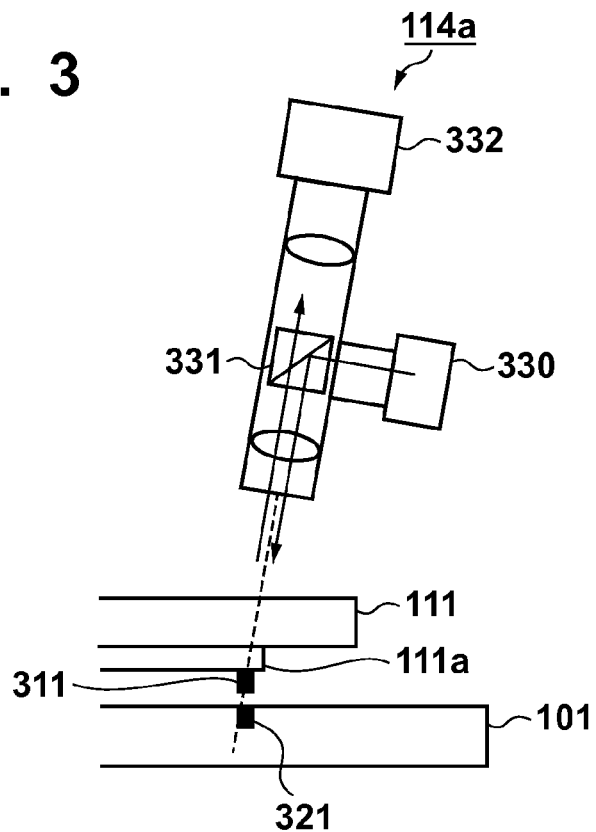
FIG. 3 is a view showing a scope of a measurement unit for detecting a mark on a substrate and a mark on a mold.

FIG. 3 is a view showing a scope 114a of the measurement unit 114 for detecting a mark 321 on the substrate and a mark 311 on the mold. As shown in FIG. 3, the mold 111 includes the region 111a in which a pattern and the mark 311 are formed. The scope 114a can include, for example, a light source 330 for emitting light, a prism 331, an image sensor 332, and a plurality of optical elements. The light emitted from the light source 330 has a wavelength different from the wavelength of light (ultraviolet rays) for curing the resin supplied on the substrate. Also, the scope 114a is inclined in order to secure the optical path of the light (ultraviolet rays) for curing the resin supplied on the substrate because the light (ultraviolet rays) is radiated from above the mold 111. The scope 114a reflects the light emitted from the light source 330 by the prism 331 formed by a half prism or polarizing beam splitter, and irradiates the mark 311 on the mold and the mark 321 on the substrate with the reflected light. Light reflected by the mold 111 and light reflected by the substrate 101 are transmitted through the prism 331, and enter the image sensor 332. Accordingly, an image of the mark 311 on the mold and an image of the mark 321 on the substrate can be formed on the image sensor 332. For example, when the mark 311 on the mold and the mark 321 on the substrate are formed by lattice patterns having different pitches, a moire image can be formed on the image sensor 332. This moire image formed on the image sensor 332 is formed by projecting the difference between the mark 311 on the mold and the mark 321 on the substrate in an enlarged scale. Therefore, it is possible to accurately detect the relative position between the mark 311 on the mold and the mark 321 on the substrate. As the mark 311 on the mold and the mark 321 on the substrate, it is also possible to use, for example, box-in-box marks.

Figure 4:
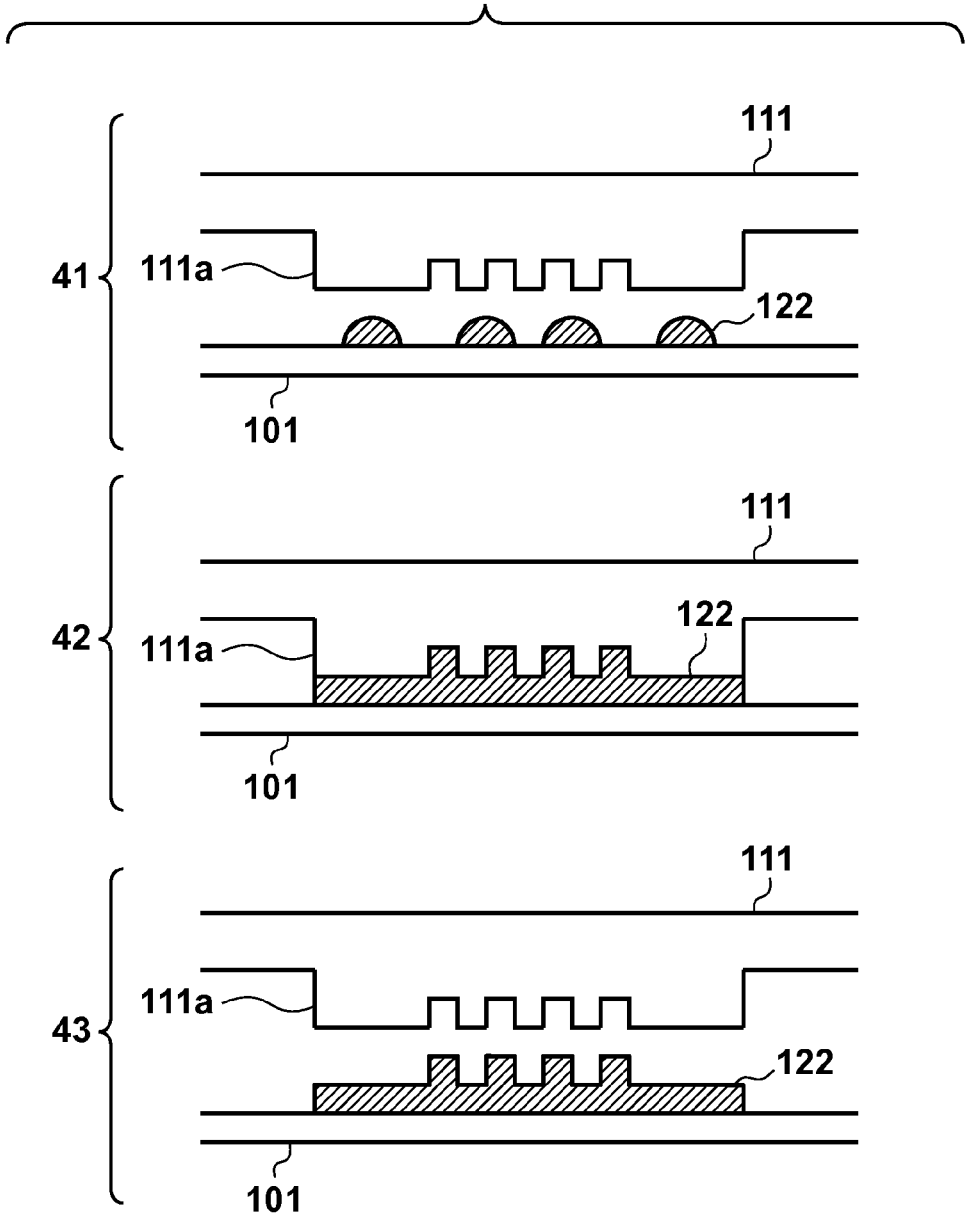
FIG. 4 is a view for explaining an imprint process in the imprint apparatus of the first embodiment.

The imprint process in the imprint apparatus 100 of the first embodiment configured as described above will be explained with reference to FIG. 4. First, the control unit 150 controls the substrate stage 106 so that a target region (for example, a shot region as a target of the imprint process) on the substrate to which a pattern of the mold 111 is to be transferred is positioned below the resin supply unit 121, thereby moving the substrate 101. When the target region is positioned below the resin supply unit 121, the control unit 150 controls the resin supply unit 121 to supply a resin 122 (uncured resin) to the target region. After the resin 122 is supplied to the target region, the control unit 150 controls the substrate stage 106 so that the target region is positioned below the region 111a on the mold where the pattern is formed, thereby moving the substrate 101. The positional relationship between the mold 111 and substrate 101 in this state is indicated by 41 in FIG. 4.

When the target region is positioned below the region 111a on the mold, the control unit 150 causes the measurement unit 114 to detect marks on the mold and marks in the target region, thereby measuring the relative position between the region 111a on the mold and the target region. Then, based on the measurement results obtained by the measurement unit 114, the control unit 150 drives the substrate stage 106 or mold holding unit 113 while the mold 111 and the resin on the substrate are not in contact with each other, thereby aligning the region 111a on the mold and the target region. After the region 111a on the mold and the target region are aligned, the control unit 150 controls the mold holding unit 113 so that the mold 111 moves in the −Z direction, thereby bringing the pattern of the mold 111 into contact with the resin 122 on the substrate. The positional relationship between the mold 111 and substrate 101 in this state is indicated by 42 in FIG. 4.

The control unit 150 allows a predetermined time to elapse while the pattern of the mold 111 and the resin 122 on the substrate are in contact with each other. Consequently, the resin 122 on the substrate can be filled in every corner of the pattern of the mold 111. After the predetermined time has elapsed since the mold 111 and the resin 122 on the substrate are brought into contact with each other, the control unit 150 controls the irradiation unit 142 to irradiate the resin 122 on the substrate with light (ultraviolet rays) through the mold 111. Then, the control unit 150 controls the mold holding unit 113 so that the mold 111 moves in the +Z direction, thereby separating the mold 111 from the resin 122 on the substrate. The positional relationship between the mold 111 and substrate 101 in this state is indicated by 43 in FIG. 4. Thus, the pattern of the mold 111 can be transferred to the resin 122 on the substrate.

In the imprint apparatus 100 of the first embodiment as described above, the mold 111 and substrate 101 are aligned (the mold 111 is positioned) while the mold 111 and the resin on the substrate are not in contact with each other. However, when the mold 111 is positioned while the mold 111 and the resin on the substrate are not in contact with each other, the pattern of the mold 111 may be transferred to a region shifted from the target region (shot region) on the substrate to which the pattern is to be transferred. Therefore, the imprint apparatus 100 of the first embodiment obtains (acquires), in advance, a shift amount (correction value) indicating the amount of shift of the pattern, which is transferred from the mold 111 to the substrate, from the target region on the substrate in the XY direction (the surface direction parallel to the surface of the substrate 101). After the mold 111 and substrate 101 are aligned with the mold 111 and resin 122 being not in contact with each other, a shift amount generated while the mold 111 is moved close to the substrate 101 and brought into contact with the resin 122 is measured. Then, with the mold 111 and the resin on the substrate being not in contact with each other, the imprint apparatus 100 aligns the mold 111 and substrate 101 by shifting the pattern of the mold 111, which is measured by the measurement unit, from the target region by the shift amount. This makes it possible to prevent the pattern of the mold 111 from being transferred to a region shifted from the target region on the substrate, and accurately transfer the pattern of the mold 111 to the target region on the substrate.

Figures 5, 6:
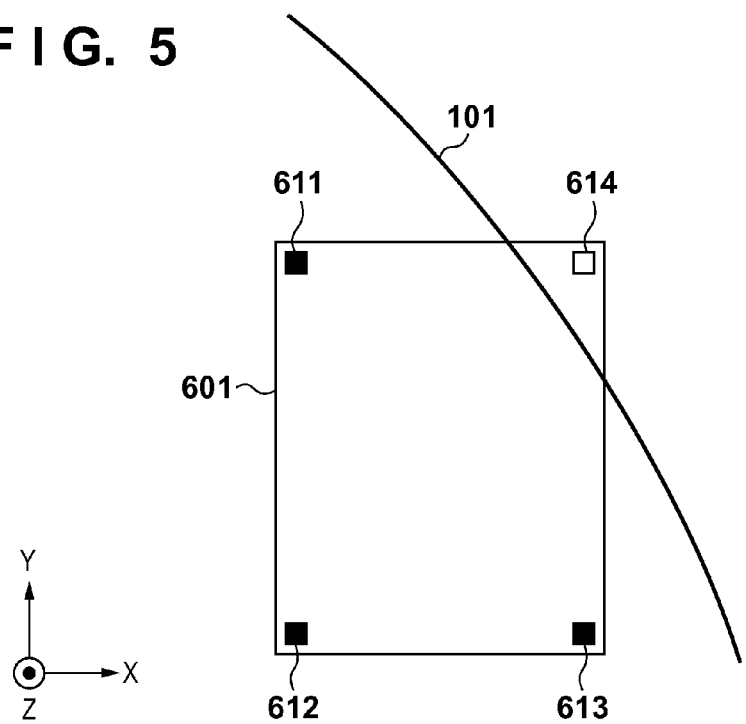
FIG. 5 is a view showing a shot region arranged in the periphery of a substrate.
FIG. 6 is a view showing a correction map.

Possible causes of the transfer of the pattern of the mold 111 to a region shifted from the target region are a shift of the mold during the process of bringing the mold 111 into contact with the resin on the substrate, and a measurement error in the measurement unit 114. As shown in FIG. 5, for example, the former becomes conspicuous when transferring the mold pattern to a shot region 601 (a shot region to which a part of the mold pattern can be transferred) arranged in the periphery of the substrate 101. When transferring the pattern of the mold 111 to the shot region 601, for example, alignment is performed by using marks 611 to 613 of a plurality of marks 611 to 614 formed in the four corners of the shot region 601, that is, without using the mark 614. In the shot region 601 like this, the mold 111 is sometimes brought into contact with the resin on the substrate while the mold 111 is slightly inclined toward the substrate 101, in order to improve the transfer performance. When the mold 111 is thus inclined toward the substrate 101, the pattern of the mold 111 may shift from the target region (the shot region in the periphery of the substrate) by the process of bringing the mold 111 into contact with the resin on the substrate. Accordingly, the imprint apparatus 100 of the first embodiment obtains a first correction value for correcting a first shift amount indicating the amount of shift of the mold during the process of bringing the mold into contact with the resin on the substrate.

The latter cause will now be explained. As shown in FIG. 3, for example, the scope 114a of the measurement unit 114 is arranged in an inclined state, so a measurement error occurs when detecting the relative position between the mark on the mold and the mark on the substrate. If a measurement error thus occurs in the measurement unit 114, the mold pattern is transferred to a region shifted from the target region even when the pattern of the mold 111 and the target region on the substrate are accurately aligned by using the measurement unit 114. Therefore, the imprint apparatus 100 of the first embodiment obtains a second correction value for correcting a second shift amount indicating the amount of shift, which occurs due to a measurement error in the measurement unit 114, of the pattern which is transferred from the mold 111 to the substrate 101, from the target region.

In the imprint apparatus 100 of the first embodiment, the mold 111 and substrate 101 are aligned by using the first and second correction values while the mold 111 and the resin on the substrate are not in contact with each other. That is, the mold 111 and substrate 101 are aligned so that the pattern of the mold 111, which is measured by the measurement unit 114 with the mold 111 and the resin on the substrate being not in contact with each other, shifts from the target region by the total amount of the first and second shift amounts. The first and second correction amounts can be obtained for each shot region on the substrate. In the following explanation, the map of the first correction values in a plurality of shot regions will be referred to as a first correction map, and the map of the second correction values in a plurality of shot regions will be referred to as a second correction map. In the imprint apparatus 100 of the first embodiment, the control unit 150 selects the first and second correction maps, and extracts the first and second correction values from the obtained first and second correction maps, in accordance with the position of the target shot region. Then, the imprint apparatus 100 performs the imprint process on the target region by using the extracted first and second correction values. Consequently, the pattern of the mold 111 can accurately be transferred to the target region. Also, in the imprint apparatus 100 of the first embodiment, the mold and substrate are aligned by using both the first and second correction values while the mold 111 and the resin on the substrate are not in contact with each other. However, the present invention is not limited to this. For example, it is also possible to align the mold 111 and substrate 101 by using only one of the first and second correction values.

Methods of generating the first and second correction maps will be explained below. First, the method of generating the first correction map will be explained. The imprint apparatus 100 calculates a change in position of the mold 111 in the surface direction (XY direction) before and after the mold 111 is driven in the vertical direction (Z direction). That is, the imprint apparatus 100 (control unit 150) causes the measurement unit 114 to measure the relative position between the pattern of the mold 111 and the shot region in both the state in which the mold 111 and the resin on the substrate are not in contact with each other and the state in which they are in contact with each other. Then, the imprint apparatus 100 calculates the difference between the relative position measured by the measurement unit 114 in the state in which the mold 111 and resin are not in contact with each other, and the relative position measured by the measurement unit 114 in the state in which the mold 111 and resin are in contact with each other. The relative position difference thus calculated is the first shift amount of the corresponding shot region, and this first shift amount is set as the first correction value. The first correction map is generated by repeating the step of setting the first correction value for a plurality of shot regions. The first correction map can be generated for each lot of the substrate 101.

Next, the method of generating the second correction map will be explained. The imprint apparatus 100 (control unit 150) causes the measurement unit 114 to measure the relative position between the pattern of the mold 111 and the shot region while the mold 111 and the resin on the substrate are in contact with each other, and transfers the pattern of the mold 111 to the substrate 101. Then, the imprint apparatus 100 calculates the difference between the relative position measured by the measurement unit 114 while the mold 111 and the resin are in contact with each other, and the relative position between the pattern which is transferred from the mold 111 to the substrate 101 and the shot region. The relative position between the pattern transferred to the substrate 101 and the shot region can be measured by using a detection unit different from the measurement unit 114 of the imprint apparatus 100. As the detection unit, it is possible to use, for example, a scope (off-axis scope) capable of detecting marks on the substrate without the mold 111 intervening between them. The relative position between the pattern transferred to the substrate 101 and the shot region may also be measured by using a superposition inspection apparatus installed outside the imprint apparatus 100. The relative position difference thus calculated is the second shift amount of the corresponding shot region, and this second shift amount is set as the second correction value. The second correction map is generated by repeating the step of setting the second correction value for a plurality of shot regions. The second correction map can be generated by the above-described method by using, for example, a dummy substrate. However, the second correction map may also be generated by performing simulation from the characteristics of a circuit pattern or resist. In addition, the second correction map can be generated for each lot of the substrates 101, like the first correction map.

FIG. 6 shows an example of the correction map (the first or second correction map). In this correction map shown in FIG. 6, a number (Shot No) is assigned in accordance with the position of each of a plurality of shot regions on the substrate, and is so generated as to contain a correction amount (the first or second correction amount) for the corresponding shot region. The correction amount can contain, for example, correction amounts for individual components below:

A correction amount (Shift_X, Shift_Y) of a shift component in the XY direction

A correction amount (Rot_X, Rot_Y) of a rotational component in the XY direction A correction amount (Mag_X, Mag_Y) of a magnification component in the XY direction A correction amount (Trap_X, Trap_Y) of a trapezoidal component in the XY direction In the imprint apparatus 100 of the first embodiment, the control unit 150 generates the first and second correction maps. However, the present invention is not limited to this. For example, the first and second correction maps may also be generated by an external computer of the imprint apparatus 100.

Figure 7:
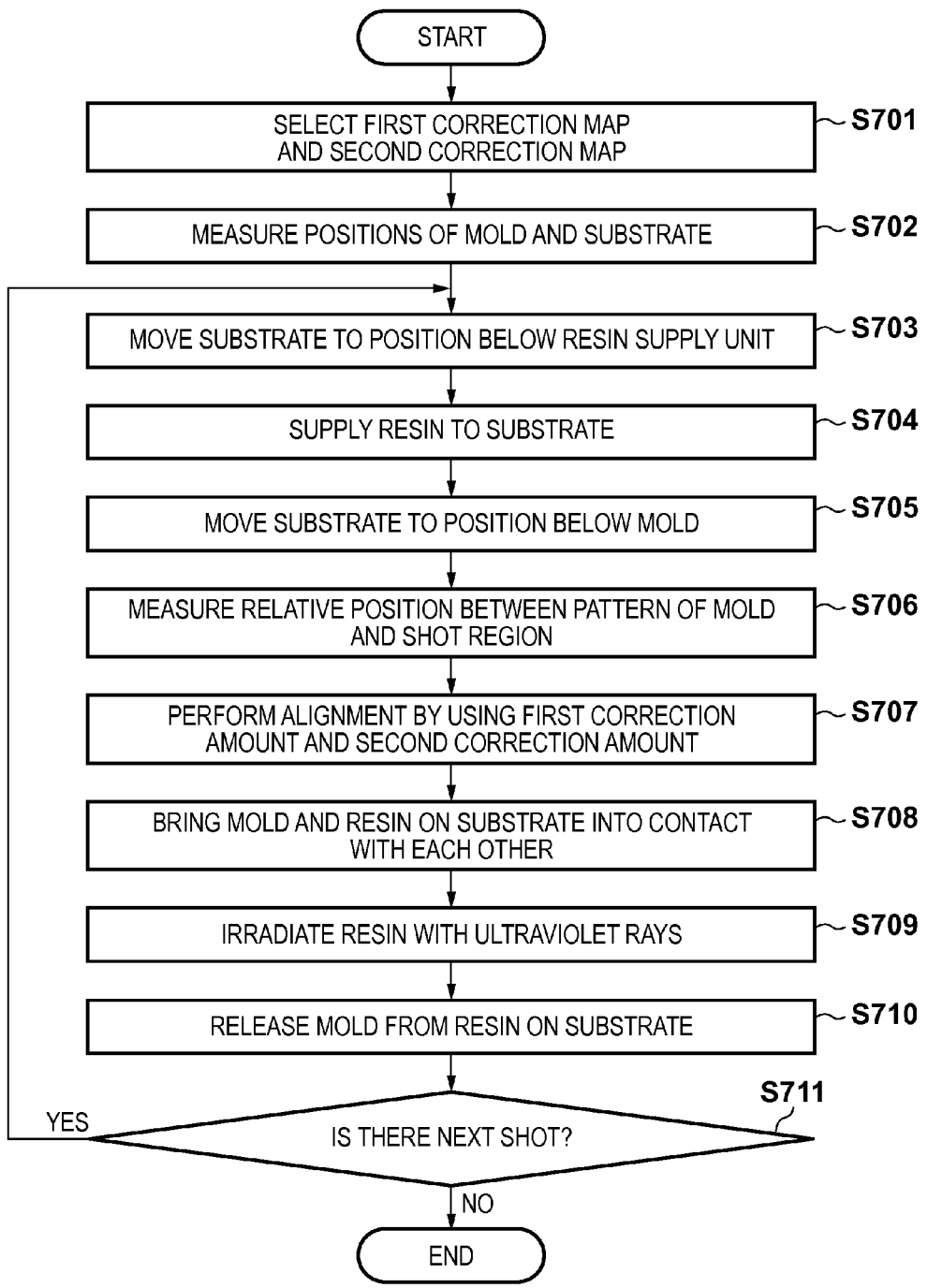
FIG. 7 is a flowchart showing an operation sequence in the imprint process of the first embodiment.

The imprint process of transferring the pattern of the mold 111 to a shot region (target region) on the substrate in the imprint apparatus 100 of the first embodiment will be explained below with reference to FIG. 7. FIG. 7 is a flowchart showing an operation sequence in the imprint process of transferring the pattern of the mold 111 to the target region on the substrate.

In step S701, the control unit 150 selects first and second correction maps corresponding to the lot of the substrate 101 as a target of the imprint process, from a plurality of first correction maps and a plurality of second correction maps generated for each lot of the substrate 101. In step S702, the control unit 150 individually measures the position of the substrate 101 and the position of the mold 111 based on the apparatus coordinates, in order to facilitate measuring the relative position between the mold 111 and substrate 101 in a later step. More specifically, the control unit 150 causes the measurement unit 114 to measure the position of each shot region on the substrate by detecting a plurality of marks on the substrate, and measure the position of the mold 111 by detecting a plurality of marks on the mold. Thus, the relative position between the mold 111 and substrate 101 can accurately be measured by individually measuring the position of each shot region and the position of the mold 111 based on the apparatus coordinates.

In step S703, the control unit 150 controls the substrate stage 106 to move the substrate 101 so that a shot region is positioned below the resin supply unit 121. In step S704, the control unit 150 controls the resin supply unit 121 to supply a resin (uncured resin) to the shot region. In step S705, the control unit 150 controls the substrate stage 106 to move the substrate 101 so that the shot region to which the resin is supplied is positioned below the pattern of the mold 111.

In step S706, the control unit 150 causes the measurement unit 114 to measure the relative position between the pattern of the mold 111 and the shot region while the mold 111 and the resin on the substrate are not in contact with each other. This makes it possible to obtain the relative position between the pattern of the mold 111 and the shot region for, for example, the shift component, rotational component, magnification component, and trapezoidal component in the XY direction. In step S707, the control unit 150 extracts first and second correction amounts corresponding to the shot region as a target of the imprint process, from the first and second correction maps obtained in step S701. Then, the control unit 150 aligns the mold 111 and substrate 101 by using the first and second correction amounts, so that the pattern of the mold 111, which is measured by the measurement unit 114, shifts from the shot region by the total amount of the first and second shift amounts. This alignment between the mold 111 and substrate 101 is performed by, for example, moving and rotating the substrate 101 by driving the substrate stage 106, or moving and rotating the mold 111 by driving the mold holding unit 113. In this step, it is also possible to deform the region 111a on the mold by applying forces to the side surfaces of the mold 111 by the correction unit 112. Consequently, when the pattern of the mold 111 is transferred to the substrate 101, the relative position between the pattern of the mold 111, which is transferred to the substrate 101, and the shot region can be set within an allowable range.

In step S708, the control unit 150 controls the mold holding unit 113 to drive the mold 111 in the vertical direction (Z direction) perpendicular to the surface direction (XY direction), so that the mold 111 is brought into contact with the resin on the substrate. In step S709, the control unit 150 controls the irradiation unit 142 to irradiate the resin in contact with the mold 111 with ultraviolet rays, thereby curing the resin. In step S710, the control unit 150 controls the mold holding unit 113 to separate (release) the mold 111 from the resin on the substrate. In step S711, the control unit 150 determines whether a shot region (next shot region) to which the pattern of the mold 111 is to be transferred next exists on the substrate. If a next shot region exists, the process advances to step S703. If no next shot region exists, the control unit 150 terminates the imprint process for one substrate.

In the imprint apparatus 100 of the first embodiment as described above, the mold 111 and substrate 101 are aligned while the mold 111 and the resin on the substrate are not in contact with each other. In this step, the imprint apparatus 100 positions the mold 111 by using the first and second correction values, so that the pattern of the mold 111, which is measured by the measurement unit 114, shifts from the target region (shot region) by the total amount of the first and second shift amounts. Accordingly, the imprint apparatus 100 can accurately transfer the pattern of the mold 111 to the target region. In addition, the throughput can be improved because the imprint apparatus 100 can align the mold 111 and substrate 101 while the mold 111 and the resin on the substrate are not in contact with each other.

In the first embodiment, the method of transferring the pattern of the mold 111 to the shot region formed on the substrate has been explained. However, the present invention is not limited to this. For example, the present invention is also applicable to a method of transferring a mold pattern to a substrate on which no shot region is formed. In this method, a target region can be managed based on not a shot region formed on the substrate but the apparatus coordinates. Also, in the first embodiment, the method of aligning the mold 111 and substrate 101 by adopting the die-by-die alignment method has been explained. However, the present invention is not limited to this, and also applicable to a method of aligning a mold and substrate by adopting the die-by-die alignment method.

Second Embodiment

An imprint apparatus of the second embodiment of the present invention will be explained. In the imprint apparatus 100 of the first embodiment, the mold 111 and substrate 101 are aligned by using the first and second correction values while the mold 111 and the resin on the substrate are not in contact with each other. On the other hand, in the imprint apparatus of the second embodiment, a mold 111 and substrate 101 are aligned by using only a first correction value while the mold 111 and a resin on the substrate are not in contact with each other. Then, the mold 111 and substrate 101 are aligned by using a second correction value while the mold 111 and the resin on the substrate are in contact with each other. Since the arrangement of the imprint apparatus of the second embodiment is the same as that of the imprint apparatus of the first embodiment, an explanation of the apparatus arrangement will be omitted in the second embodiment.

An imprint process of transferring a pattern of the mold 111 to a shot region (target region) on the substrate in the imprint apparatus of the second embodiment will be explained below with reference to FIG. 8. FIG. 8 is a flowchart showing an operation sequence in the imprint process of transferring the pattern of the mold 111 to the shot region on the substrate.

Steps S801 to S806 shown in FIG. 8 are the same as steps S701 to S706 shown in FIG. 6, so an explanation thereof will be omitted. In step S807, a control unit 150 extracts a first correction value corresponding to the shot region as a target of the imprint process, from first correction maps obtained in step S801. Then, the control unit 150 aligns the mold 111 and substrate 101 by using the first correction value so that the pattern of the mold 111, which is measured by a measurement unit 114, shifts from the shot region by a first shift amount. In step S808, the control unit 150 controls a mold holding unit 113 to drive the mold 111 in the vertical direction (Z direction) perpendicular to the surface direction (XY direction), so that the mold 111 and a resin on the substrate are brought into contact with each other. In step S809, the control unit 150 extracts a second correction value corresponding to the shot region as a target of the imprint process from second correction maps obtained in step S801. Subsequently, the control unit 150 aligns the mold 111 and substrate 101 by using the second correction value so that the pattern of the mold 111, which is measured by the measurement unit 114, shifts from the shot region by a second shift amount. When the pattern of the mold 111 is transferred to the substrate 101, therefore, the relative position between the pattern of the mold 111, which is transferred to the substrate 101, and the shot region can be set within an allowable range. In step S810, the control unit 150 controls an irradiation unit 142 to irradiate the resin in contact with the mold 111 with ultraviolet rays, thereby curing the resin. In step S811, the control unit 150 controls the mold holding unit 113 to increase the distance between the mold 111 and substrate 101, thereby separating (releasing) the mold 111 from the resin on the substrate. In step S812, the control unit 150 determines whether a shot region (next shot region) to which the pattern of the mold 111 is to be transferred next exists on the substrate. If a next shot region exists, the process advances to step S803. If no next shot region exists, the control unit 150 terminates the imprint process for one substrate.

In the imprint apparatus of the second embodiment as described above, the mold 111 and substrate 101 are aligned by using the first correction value while the mold 111 and the resin on the substrate are not in contact with each other. Then, the mold 111 and substrate 101 are aligned by using the second correction value while the mold 111 and the resin on the substrate are in contact with each other. Accordingly, like the imprint apparatus 100 of the first embodiment, the imprint apparatus of the second embodiment can accurately transfer the pattern of the mold 111 to the target region. Also, in the imprint apparatus of the second embodiment, the second shift amount need only be corrected while the mold 111 and the resin on the substrate are in contact with each other. Therefore, it is possible to reduce change (correction) amounts of the relative position between the mold 111 and substrate 101 while the mold 111 and the resin are in contact with each other, and improve the throughput.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a resin dispensed on a substrate (a step of performing an imprint process on the substrate) by using the above-mentioned imprint apparatus, and a step of processing the substrate on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-127986 filed on Jun. 18, 2013, which is hereby incorporated by reference herein in its entirety.

What is claimed is:

1. An imprint apparatus which forms a pattern of an imprint material on a target region of a substrate using a mold, comprising:
a driving device configured to relatively drive the mold and the substrate;
a measurement device configured to measure a relative position between the mold and the target region, in a surface direction parallel to a surface of the substrate;
a controller configured to control alignment between the mold and the target region in the surface direction, based on a measurement result by the measurement device, in a non-contact state where the mold and the imprint material are not in contact with each other, and then control the driving device so as to bring the mold and the imprint material into contact with each other,
wherein the controller, based on information on a shift amount, which is an amount of shift of the mold from the target region in the surface direction, the shift amount being caused by contact of the mold and the imprint material and including a difference between the relative position before the contact and the relative position after the contact, controls the alignment in the non-contact state such that the relative position between the mold and the target region is shifted by an amount for correcting the shift amount in the surface direction.

2. The apparatus according to claim 1, wherein the controller controls the alignment in the non-contact state, such that the relative position is shifted, by the amount for correcting the shift amount, from a state where the mold and the target region are aligned in the surface direction.

3. The apparatus according to claim 1, wherein the controller, based on second information indicating a second shift amount between the pattern of the imprint material to be formed on the substrate and the target region, the second shift amount being caused by a measurement error in the measurement device, further controls the alignment in the non-contact state such that the relative position between the mold and the target region is further shifted by an amount for correcting the second shift amount in the surface direction.

4. The apparatus according to claim 3, wherein
the second shift amount includes a difference to be generated between the relative position measured by the measurement device, and a relative position between the pattern of the imprint material and the target region.

5. The apparatus according to claim 1,
wherein after bringing the mold and the imprint material into contact with each other, the controller controls a second alignment between the mold and the target region in the surface direction, based on a measurement result by the measurement device, in a contact state where the mold and the imprint material are in contact with each other,
wherein the controller, based on second information indicating a second shift amount between the pattern of the imprint material to be formed on the substrate, and the target region, the second shift amount being caused by a measurement error in the measurement device, controls the second alignment in the contact state such that the relative position between the mold and the target region is shifted by an amount for correcting the second shift amount in the surface direction.

6. The apparatus according to claim 5, wherein
the second shift amount includes a difference to be generated between the relative position measured by the measurement device, and the relative position between the pattern of the imprint material and the target region.

7. The apparatus according to claim 1, wherein
the substrate includes a plurality of shot regions, and the controller controls the alignment in the non-contact state based on the information for each shot region.

8. The apparatus according to claim 3, wherein
the substrate includes a plurality of shot regions, and
the controller controls the alignment in the non-contact state based on the second information for each shot region.

9. The apparatus according to claim 5, wherein
the substrate includes a plurality of shot regions, and
the controller controls the second alignment in the contact state based on the second information for each shot region.

10. The apparatus according to claim 1, wherein the controller controls the alignment in the non-contact state, by using a die-by-die alignment method.

11. An imprint apparatus which forms a pattern of an imprint material on a target region of a substrate using a mold, comprising:
a driving device configured to relatively drive the mold and the substrate;
a measurement device configured to measure a relative position between the mold and the target region, in a surface direction parallel to a surface of the substrate;
a controller configured to control alignment between the mold and the target region in the surface direction, based on a measurement result by the measurement device, in a non-contact state where the mold and the imprint material are not in contact with each other, and then control the driving device so as to bring the mold and the imprint material into contact with each other,
wherein the controller, based on information on a first shift amount and a second shift amount, the first shift amount being an amount by which the mold is to be shifted from the target region in the surface direction by bringing the mold and the imprint material into contact with each other, and the second shift amount being an amount by which a pattern of the mold which is aligned to the target region and transferred on the substrate is to be shifted from the target region, controls the alignment in the non-contact state such that the relative position between the mold and the target region is shifted by an amount for correcting a total amount of the first shift amount and the second shift amount.

12. An imprint apparatus which forms a pattern of an imprint material on a target region of a substrate using a mold, comprising:
a driving device configured to relatively drive the mold and the substrate;
a measurement device configured to measure a relative position between the mold and the target region, in a surface direction parallel to a surface of the substrate;
a controller configured to control first alignment between the mold and the target region in the surface direction, based on a measurement result by the measurement device, in a non-contact state where the mold and the imprint material are not in contact with each other, control the driving device so as to bring the mold and the imprint material into contact with each other, and then control second alignment between the mold and the target region in the surface direction, based on a measurement result by the measurement device, in a contact state where the mold and the imprint material are in contact with each other,
wherein the controller:
controls, based on information on a first shift amount being an amount by which the mold is to be shifted from the target region in the surface direction by bringing the mold and the imprint material into contact with each other, the first alignment in the non-contact state such that the relative position between the mold and the target region is shifted by an amount for correcting the first shift amount, and
controls, based on information on a second shift amount being an amount by which a pattern of the mold which is aligned to the target region and transferred on the substrate is to be shifted from the target region, the second alignment in the contact state such that the relative position between the mold and the target region is shifted by an amount for correcting the second shift amount.

* * * * *